Figure 1:
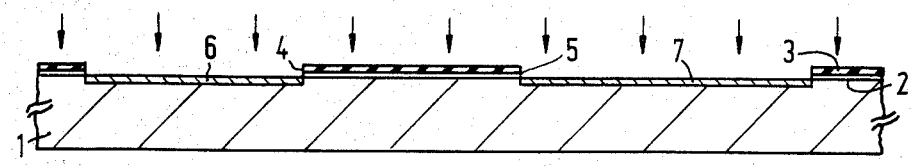
Figure 2:
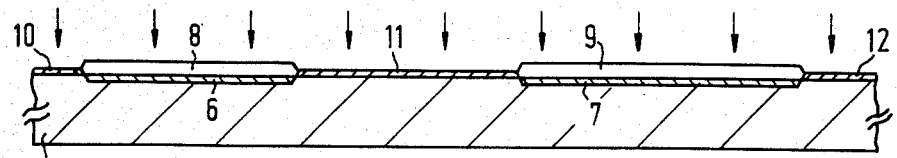

United States Patent [19]

Jochems

[11] Patent Number: 4,535,529

[45] Date of Patent: Aug. 20, 1985

[54] METHOD OF MAKING SEMICONDUCTOR DEVICES BY FORMING AN IMPURITY ADJUSTED EPITAXIAL LAYER OVER OUT DIFFUSED BURIED LAYERS HAVING DIFFERENT LATERAL CONDUCTIVITY TYPES

[75] Inventor: Pieter J. W. Jochems, Heeze, Netherlands

[73] Assignee: U.S. Philips Corporation, New York, N.Y.

[21] Appl. No.: 627,308

[22] Filed: Jul. 2, 1984

[30] Foreign Application Priority Data

Jul. 5, 1983 [NL] Netherlands ......................... 8302383

[51] Int. Cl.³ .................... H01L 21/20; H01L 21/225
[52] U.S. Cl. .................................... 29/571; 29/576 B; 29/578; 148/1.5; 148/175; 148/187; 357/23.1; 357/91
[58] Field of Search .................... 29/571, 576 B, 578; 148/1.5, 187, 175; 357/23, 91

[56] References Cited

U.S. PATENT DOCUMENTS

| | | | |
|---|---|---|---|
| 4,128,439 | 12/1978 | Jambotkar | 148/1.5 |
| 4,132,573 | 1/1979 | Kraft | 148/175 |
| 4,168,997 | 9/1979 | Compton | 148/175 |
| 4,420,344 | 12/1983 | Davies et al. | 148/1.5 |
| 4,420,872 | 12/1983 | Zaldivar | 29/571 |
| 4,442,591 | 4/1984 | Haken | 148/1.5 |
| 4,443,933 | 4/1984 | De Brebisson | 29/578 |
| 4,466,171 | 8/1984 | Jochems | 148/191 |

Primary Examiner—Upendra Roy
Attorney, Agent, or Firm—Paul R. Miller

[57] ABSTRACT

A method of manufacturing a semiconductor device is provided in which semiconductor circuit elements are provided in regions formed by diffusion from one or more buried layers into an epitaxial layer. The diffusion is carried out such that a surface layer having substantially the same doping as the original epitaxial layer is left above the diffused into epitaxial layer above the buried layer. The surface layer serves as a reference doping for insulated gate field effect transistors to be formed. This is of a particular importance for threshold voltage determinations in CMOS circuits having adjoining "twin tub" regions diffused from buried layers of opposite conductivity types.

10 Claims, 10 Drawing Figures

METHOD OF MAKING SEMICONDUCTOR DEVICES BY FORMING AN IMPURITY ADJUSTED EPITAXIAL LAYER OVER OUT DIFFUSED BURIED LAYERS HAVING DIFFERENT LATERAL CONDUCTIVITY TYPES

The invention relates to a method of manufacturing a semiconductor device in which a dopant is introduced into a surface part of a semiconductor substrate region for forming at least a first buried layer of a first conductivity type, after which an epitaxial layer having a lower overall doping concentration in atoms/cm$^2$ than the buried layer is grown onto the substrate region and a region of the first conductivity type is formed by diffusion from the buried layer into the overlying part of the epitaxial layer, in which region surface-adjoining semiconductor zones of a semiconductor circuit element are provided.

The invention further relates to a semiconductor device manufactured by the method.

A method having the features described above is known from published British Patent Application GB-A 2075257 of the Applicant.

During the manufacture of an integrated semiconductor device, in which semiconductor circuit elements are provided in a region obtained by diffusion from a buried layer, as described above, problems frequently arise with respect to the reproducibility of the electrical characteristics. In fact, in many cases these characteristics are more or less strongly dependent upon the doping concentration at the surface of the region diffused from the buried layer. For example, the threshold voltage of an insulated gate field effect transistor provided in this region is strongly dependent upon the doping at the surface. The factors which in the method described influence the doping concentration at the surface are mainly the doping and the thickness of the epitaxial layer, as well as the doping concentration of the buried layer at least in the case when the doping of the region obtained by outdiffusion is determined completely or substantially completely by diffusion from the buried layer to the surface. The doping concentration at the surface can then vary to a comparatively large extent due to small deviations in the thickness of the epitaxial layer and/or in the implantation parameters of the buried layer.

Especially in the case in which the epitaxial layer and the buried layer are of opposite conductivity types, this may result in the occurrence of relatively important deviations in the surface doping. If, due to an accidental thickening of the epitaxial layer or due to an accidental reduction of the doping concentration of the buried layer, the point at which the doping concentration diffused from the buried layer just compensates the background doping concentration of the epitaxial layer is located beneath the surface, an inversion layer may even be obtained at the surface.

These phenomena play a particularly important part when an insulated gate field effect transistor is formed in the region obtained by outdiffusion. Under the influence of the aforementioned factors, the threshold voltage of this transistor may exhibit a comparatively large spread between different semiconductor wafers processed simultaneously.

The invention has inter alia for its object to provide an improved method in which, independently of accidental variations in the thickness of the epitaxial layer and in the doping of the buried layer, accurately defined and reproducible characteristics can be obtained.

According to the invention, a method of the kind described in the opening paragraph is characterized in that the diffusion is effected in a manner such that above the buried layer there remains a surface layer having substantially the same doping concentration as the original epitaxial layer, after which at least one insulated gate field effect transistor is provided in the remaining surface layer above the buried layer.

According to the invention, the diffusion from the buried layer is intentionally carried out in a manner such that there is present at the surface a constant reference doping, which serves as a basic doping level for the IGFET to be provided, as a result of which accidental variations of the kind described above in the thickness of the epitaxial layer and/or in the doping of the buried layer are no longer of importance.

Advantageously an implantation with ions determining the threshold voltage is effected in the channel region in the surface layer. This is especially of importance when the buried layer and the epitaxial layer are of opposite conductivity types. Due to the implantation, the surface layer is converted into the conductivity type of the buried layer and at the same time the threshold voltage is determined in a reproducible manner. In given circumstances, this implantation can be effected without an additional implantation mask, as will be described hereinafter.

The invention is of particular importance in a preferred embodiment of the method in which beside the first buried layer of the first conductivity type there is formed a second buried layer of the second opposite conductivity type having a dopant which at the same temperature diffuses at substantially the same rate into the epitaxial layer as that of the first buried layer and in which a second insulated gate field effect transistor having a structure complementary to the first field effect transistor is formed in the part of the epitaxial layer overlying the second buried layer. Except for any later threshold adjusting implantations, the threshold voltage of one transistor is then determined by the background doping of the epitaxial layer, and the threshold voltage of the other transistor is determined by a separate ion implantation, as will be described more fully hereinafter. When silicon is used as semiconductor material, boron and phosphorus can be used as dopants for the two respective buried layers.

Figure 3:
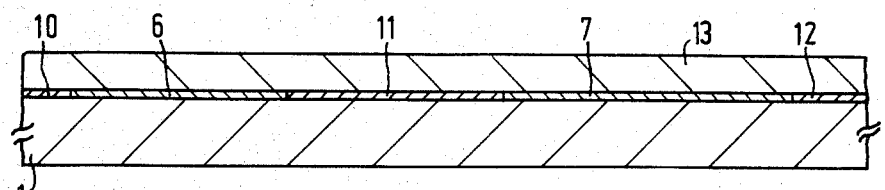
Figure 4:
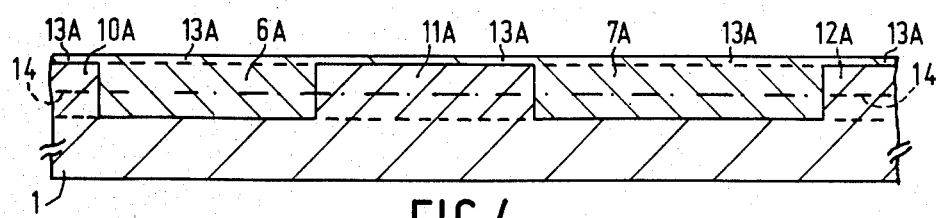
Figure 4A:
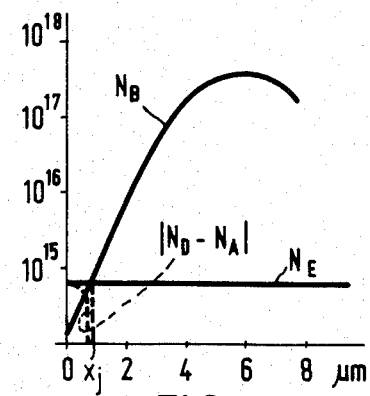
Figure 4B:
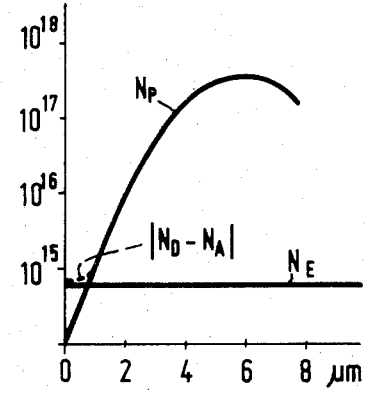

An embodiment of the invention will now be described, by way of example, more fully with reference to the drawing, in which FIGS. 1 to 3 and FIGS. 5 to 8 show a portion of a semiconductor body at successive stages of an example of the method in accordance with the invention, and FIGS. 4A and 4B illustrate diffusion profiles in parts of the body portion.

The Figures are not drawn to scale, while for the sake of clarity in particular the dimensions in the direction of thickness of the cross-sections of FIGS. 1 to 3 and 5 to 8 are comparatively strongly exaggerated. Semiconductor regions of the same conductivity type in these cross-sections are hatched in the same direction. Corresponding parts are generally designated in the drawing by the same reference numerals.

FIGS. 1 to 3 and 5 to 8 show diagrammatically in cross-section successive stages in the manufacture of a semiconductor device, in this example an integrated circuit comprising two complementary MOS transistors and a bipolar transistor, by the use of a method in accordance with the invention.

The starting material (see FIG. 1) is a semiconductor substrate region 1, in this example a p-type conducting silicon wafer having a resistivity of, for example, 10 $\Omega.cm$ and preferably a surface with a $<100>$ orientation. There is formed on this surface by thermal oxidation a thin oxide layer 2 having a thickness of, for example, 50 nm. Subsequently, by the use of known techniques a silicon nitride layer 3 having a thickness of, for example, 150 nm is deposited on this oxide layer 2. Subsequently, with the use of conventional photolithographic techniques, openings 4 and 5 are etched beside each other in the layers 2 and 3. By implantation of phosphorus ions (dose, for example, $2 \times 10^{14}$ ions/cm$^2$, energy 170 keV), n-type layers 6 and 7 are formed in these openings, the layers 2 and 3 then serving as an implantation mask.

By thermal oxidation with the layers 2 and 3 serving as an anti-oxidation mask, oxide layers 8 and 9 are formed on the layers 6 and 7 (see FIG. 2), after which the layers 2 and 3 are removed by etching and p-type layers 10, 11 and 12 are formed by implantation of boron ions. The dose in this example also is $2 \times 10^{14}$ ions/cm$^2$ and the energy is 40 keV; the oxide layers 8 and 9 serve as an implantation mask for this implantation.

After the oxide layers 8 and 9 have been removed by etching, an n-type conducting silicon layer 13 is grown epitaxially onto the surface; see FIG. 3. The layers 6, 7, 10, 11 and 12 are shown in FIG. 3 and the following Figures at the same level and with the same thickness for the sake of clarity of the drawing. They constitute buried layers, the layers 10, 11 and 12 being of the first conductivity type, or of the p-conductivity type, and the layers 6,7 as well as the epitaxial layer 13 being of the second n-conductivity type.

The buried layers may also be applied by techniques different from the manner described above. Thus, for example, first a layer of the one conductivity type may be applied over the whole surface, after which this layer is etched away at given areas, and with the use of the etching mask as doping mask the buried layers of the other conductivity type are formed at these areas, as is described, for example, in the Dutch Application No. 8002492, FIGS. 1 to 5, also corresponding to U.S. Pat. No. 4,466,171.

In the example described here, the epitaxial layer 13 has a thickness of 7.5 μm and a doping concentration of $8 \times 10^{14}$ phosphorus atoms/cm$^3$ or an overall doping of $7.5 \times 10^{-4} \times (8 \times 10^{14}) = 6 \times 10^{11}$ atoms/cm$^2$, so a lower overall doping than the buried layers 6, 7, 10, 11 and 12.

Subsequently, a heat treatment is carried out for 5 hours at 1200° C., during which heat treatment a region of the conductivity type of the relevant buried layer is formed by diffusion from each buried layer in the overlying part of the epitaxial layer. Thus, (see FIG. 4) p-type conducting regions 10A, 11A and 12A are formed above the buried layers 10, 11 and 12, while n-type conducting regions 6A and 7A are formed above the buried layers 6 and 7. The buried layers also diffuse into the substrate region 1; the position of the original interface between the epitaxial layer 13 and the substrate region 1 is indicated by the dot-and-dash line 14. The pn junctions between the p-type regions 10A, 11A and 12A on the one hand and the n-type regions 6A and 7A on the other hand are substantially at right angles to the surface because boron and phosphorus diffuse at substantially the same rate, as is described more extensively in the aforementioned Dutch Application No. 8002492 corresponding to U.S. Pat. No. 4,466,171, so that the lateral diffusions of boron and phosphorus substantially compensate each other.

According to the invention, the diffusion is effected in a manner such (i.e. the time and the temperature of the diffusion are chosen such) that there remains above the buried layer, in this example above each buried layer, at the surface a thin layer 13A of the n-type conducting epitaxial layer 13 having substantially the original doping, as indicated in FIG. 4. This thin n-type surface layer 13A forms pn junctions with the p-type regions 10A, 11A and 12A. When semiconductor circuit elements are provided in the regions 6A, 7A, 10A, 11A and 12A, this surface layer 13A is available as a reference doping, which is independent of accidental variations in the doping of the buried layers and in the thickness of the epitaxial layer 13.

FIG. 4A shows diagrammatically the diffusion profile ($N_B$) of the boron atoms in the regions 10A, 11A and 12A at right angles to, and reckoned from the surface. FIG. 4B likewise shows diagrammatically the diffusion profile of the phosphorus atoms ($N_P$) in the regions 6A and 7A. In both cases, the n-type background doping ($N_E$) of the epitaxial layer 13 is also shown. The absolute value of the overall resulting net n-doping $N_D - N_A$ near the surface is indicated by a dotted line. In the case of FIG. 4A, as already stated above, there is present at the surface an n-type layer (13A) which forms a pn junction at a depth $X_j$ of approximately 0.6 μm with the underlying region (10A, 11A or 12A).

Subsequently, semiconductor zones forming part of the various semiconductor circuit elements are provided in the regions 6A, 7A and 11A. In this example this is done in the following manner.

First an anti-oxidation mask is provided on the surface. For this purpose, a thin thermal oxide layer 15 and on it a silicon nitride layer 16 are formed, after which these layers are patterned in the desired manner by conventional photolithographic etching techniques, the anti-oxidation mask thus obtained leaving edge portions of these regions free in each of the regions 6A, 7A and 11A located above the buried layers; see FIG. 5.

Figure 5:
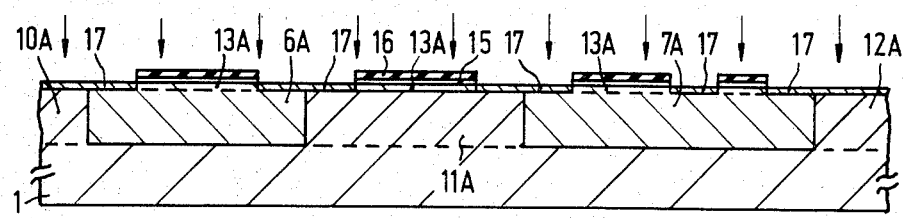

Subsequently, by implantation of phosphorus ions at an energy of, for example, 70 keV and a dose of $10^{12}$ ions/cm$^2$ n-type conducting channel stopper zones 17 are formed; see FIG. 5. The anti-oxidation mask (15,16) then serves as the implantation mask.

Figure 6:
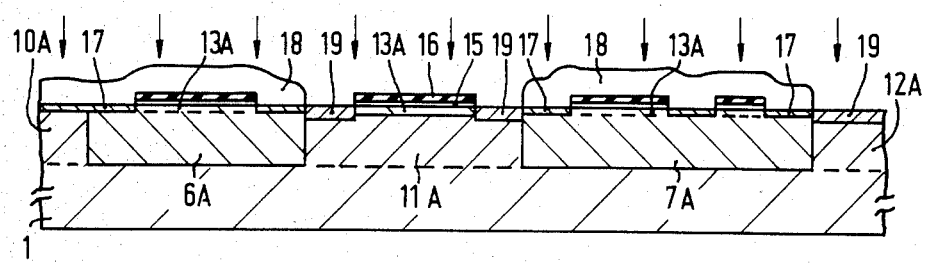

Then, an implantation mask 18 in the form of a photolacquer layer is provided outside the region 11A; see FIG. 6. p-type channel stopper zones 19 are then formed selectively in the edge portions of the region 11A by implantation of boron ions (dose $5.10^{13}$ ions/cm$^2$, energy 16 keV) (see FIG. 6), which boron implantation overdopes the preceding phosphor implantation 17. Both the photolacquer layer 18 and the oxide-nitride layer (15,16) mask against this boron implantation.

Figure 7:
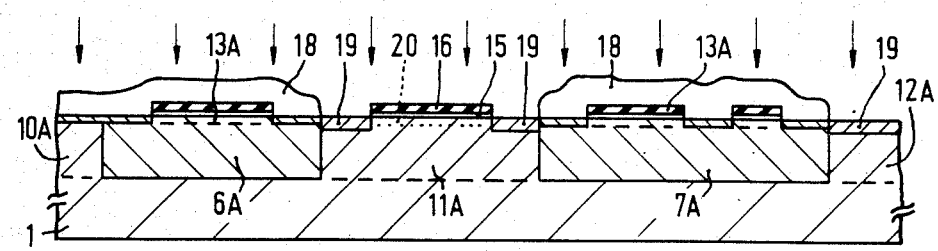
Figure 8:
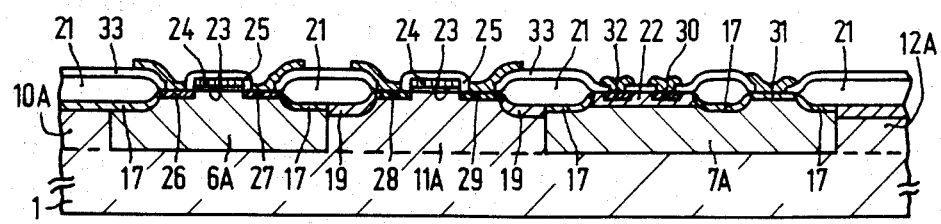

Subsequently, an implantation with boron ions is carried out in the region 11A in the channel region of the field effect transistor to be formed in the surface layer 13A, as a result of which the n-type layer 13A becomes p-conducting; see FIG. 7. The latter implantation 20 at an energy of 60 keV and a dose of $10^{11}$ ions/cm$^2$ penetrates partly through the anti-oxidation mask (15,16), but not through the photolacquer layer 18 and determines the threshold voltage, except for any later threshold controlling or adjusting implantations.

The photolacquer layer 18 is then removed. Subsequently (see FIG. 8), an oxide pattern 21 partly sunk into the semiconductor body is formed by heating at 1000° C. for 2 hours in an atmosphere of moist oxygen, after which the anti-oxidation mask (15,16) is removed by etching. The channel stopper zones 17 and 19 are then located beneath the oxide pattern 21.

Semiconductor circuit elements are now provided in a usual manner in the parts of the silicon surface exposed after removal of the anti-oxidation mask (15,16). In this example (see FIG. 8), these elements are a p-channel MOS transistor of the enhancement type in the n-type region 6A, an n-channel MOS transistor, likewise of the enhancement type, in the p-type region 11A and a bipolar vertical npn transistor in the n-type region 7A. The oxide pattern 21 is used as a doping mask. The p-type base zone 22 of the bipolar transistor may be formed, for example, by implantation of boron ions while covering the further exposed parts of the silicon surface by a non-critical photolacquer mask. Subsequently, the surface is covered by thermal oxidation with an oxide layer 23 of about 50 nm thickness, on which a polycrystalline silicon layer 24 is deposited by means of known techniques. After the latter has been made strongly n-conducting by diffusion or implantation, the gate electrodes, inclusive of connections and inter-connections of the MOS transistor circuit, are formed therefrom by photolithographic etching; see FIG. 8. The latter are provided by thermal oxidation with an oxide layer 25 and are then used in conjunction with non-critical photolacquer masks as an implantation mask for the implantation of the p-type source and drain zones 26 and 27 in the region 6A and of the n-type source and drain zones 28 and 29 in the region 11A. The emitter zone 30 and the collector contact zone 31 of the bipolar transistor can be formed simultaneously with the source and drain zones 28 and 29, while the base contact zone 32 can be formed simultaneously with the source and drain zones 26 and 27.

Finally, the various connection electrodes are provided through windows in an oxide layer 33 formed on the assembly, after which the device can be arranged in a suitable envelope and further finished in a usual manner.

It should be appreciated that in principle also semiconductor materials other than silicon and other materials for masking against doping and against oxidation may be used. This depends upon the technological conditions and possibilities and is not essential to the invention. Furthermore, in the given example all conductivity types may be replaced (simultaneously) by the opposite conductivity types.

What is claimed is:

1. A method of manufacturing a semiconductor device comprising the steps of forming at least a first buried layer of a first conductivity type by introducing a dopant into a surface of a semiconductor substrate, growing onto said substrate an epitaxial layer having a lower overall doping in atoms/cm$^2$ than said buried layer, forming a region of said first conductivity type in said epitaxial layer by diffusion from said buried layer, and providing surface adjoining semiconductor zones of a semiconductor circuit element in said region, wherein the improvement comprises the steps of
limiting said diffusion into said epitaxial layer to form a surface layer of said epitaxial layer having substantially the same doping concentration as the original epitaxial layer, and
providing at least one insulated gate field effect transistor in said surface layer.

2. A method according to claim 1, wherein said epitaxial layer is of a second conductivity type opposite to said first conductivity type.

3. A method according to claim 1, wherein a second buried layer of said second conductivity type is formed beside said first buried layer, said second buried layer having a second dopant diffusing substantially at the same rate into said epitaxial layer as said dopant of said first buried layer, and wherein a second insulated gate field effect transistor having a structure complementary to said first field effect transistor is formed in a part of said epitaxial layer above said second buried layer.

4. A method according to claim 2, wherein a second buried layer of said second conductivity type is formed beside said first buried layer, said second buried layer having a second dopant diffusing substantially at the same rate into said epitaxial layer as said dopant of said first buried layer, and wherein a second insulated gate field effect transistor having a structure complementary to said first field effect transistor is formed in a part of said epitaxial layer above said second buried layer.

5. A method according to claim 1 or claim 2, wherein an ion implantation is carried out in a channel region of said field effect transistor in said surface layer, said ion implantation being with ions determining a threshold voltage of said field effect transistor.

6. A method according to claim 5, wherein after said diffusion an anti-oxidation mask is provided at least at an area of said field effect transistor, said anti-oxidation mask leaving exposed edge portions of said region; an implantation mask is provided outside said region, and channel stopper zones are formed selectively in said edge portions by another ion implantation, wherein said another ion implantation is carried out at an energy to enable ions to penetrate through said anti-oxidation mask but be stopped by said implantation mask, and wherein after said another ion implantation said implantation mask is removed and a sunken oxide pattern is formed by thermal oxidation in parts of said surface layer free of said anti-oxidation mask.

7. A method according to claim 6, wherein a second buried layer of said second conductivity type is formed beside said first buried layer, said second buried layer having a second dopant diffusing substantially at the same rate into said epitaxial layer as said dopant of said first buried layer, and wherein a second insulated gate field effect transistor having a structure complementary to said first field effect transistor is formed in a part of said epitaxial layer above said second buried layer.

8. A method according to claim 7, wherein said epitaxial layer is silicon, and phosphorus and boron are said dopants from said buried layers.

9. A method according to claim 4, wherein said epitaxial layer is silicon, and phosphorus and boron are said dopants from said buried layers.

10. A method according to claim 3, wherein said epitaxial layer is silicon, and phosphorus and boron are said dopants from said buried layers.

* * * * *